(12) United States Patent
Pinto et al.

(10) Patent No.: US 6,657,279 B1
(45) Date of Patent: Dec. 2, 2003

(54) PNP LATERAL BIPOLAR ELECTRONIC DEVICE AND CORRESPONDING MANUFACTURING PROCESS

(75) Inventors: Angelo Pinto, Augusta (IT); Carlo Alemanni, Acireale (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/637,956

(22) Filed: Aug. 11, 2000

Related U.S. Application Data

(62) Division of application No. 09/087,397, filed on May 29, 1998, now Pat. No. 6,146,956.

(30) Foreign Application Priority Data

May 30, 1997 (EP) ............................................. 97830260

(51) Int. Cl.[7] ............................................. H01L 29/735
(52) U.S. Cl. ..................... 257/557; 257/588; 257/593
(58) Field of Search ................................. 257/557, 587, 257/588, 593

(56) References Cited

U.S. PATENT DOCUMENTS

| | | | | |
|---|---|---|---|---|
| 4,437,897 A | | 3/1984 | Kemlage | 438/365 |
| 4,507,171 A | * | 3/1985 | Bhatia et al. | 257/557 |
| 4,510,676 A | | 4/1985 | Anantha | 29/577 C |
| 4,669,177 A | * | 6/1987 | D'Arrigo et al. | 257/593 |
| 5,355,015 A | * | 10/1994 | McFarlane et al. | 257/557 |
| 5,637,516 A | | 6/1997 | Miller | 438/203 |
| 5,666,001 A | * | 9/1997 | Miwa | 257/557 |
| 5,796,157 A | | 8/1998 | Fallico et al. | 257/557 |
| 6,198,154 B1 | * | 3/2001 | Pinto et al. | 257/557 |

FOREIGN PATENT DOCUMENTS

EP         0 435 308 A1        7/1991

OTHER PUBLICATIONS

Michel, A.E. and A. Schmitt, "Stabilized Lateral PNP Transistor," *IBM Technical Disclosure Bulletin*, 24(10):5154–5155, Mar., 1982.

* cited by examiner

*Primary Examiner*—Gene M. Munson
(74) *Attorney, Agent, or Firm*—Lisa K. Jorgenson; Robert Iannucci; Seed IP Law Group PLLC

(57) ABSTRACT

The invention relates to a process for making a lateral PNP bipolar electronic device integrated monolithically on a semiconductor substrate together with other bipolar devices of the NPN type, said device being incorporated to an electrically insulated multilayer structure. The device includes a semiconductor substrate doped with impurities of the P type; a first buried layer doped with impurities of the N type to form a base region; and a second layer, overlying the first and having conductivity of the N type, to form an active area with opposite collector and emitter regions being formed in said active area and separated by a base channel region. The width of the base channel region is defined essentially by a contact opening formed above an oxide layer deposited over the base channel region. Advantageously, the contact opening is formed by shifting an emitter mask.

12 Claims, 3 Drawing Sheets

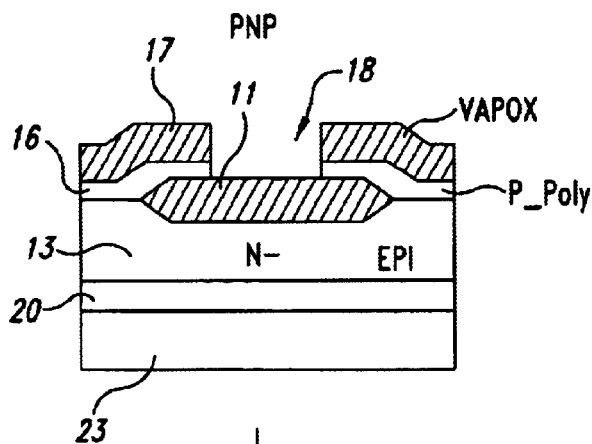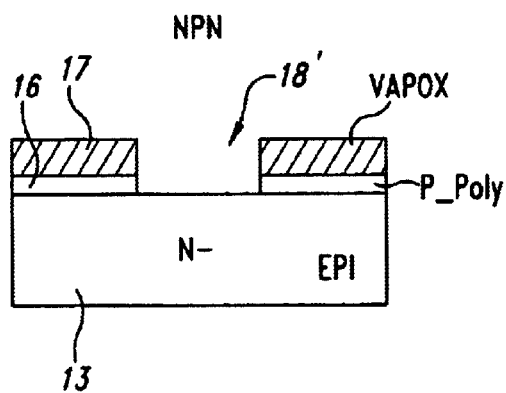
*FIG. 5*          *FIG. 8*
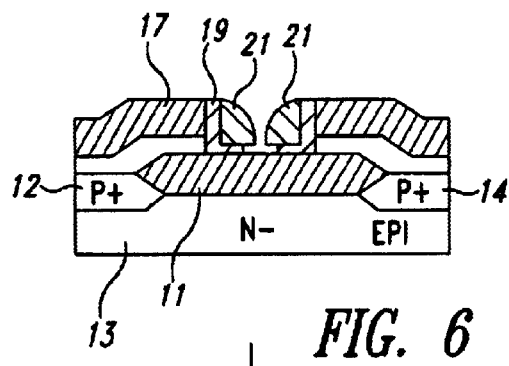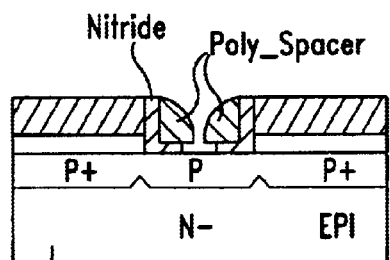
*FIG. 6*          *FIG. 9*
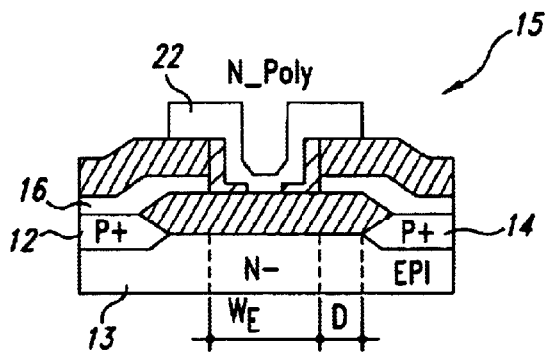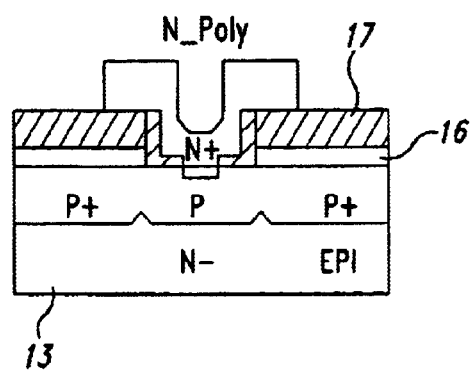
*FIG. 7*          *FIG. 10*

US 6,657,279 B1

PNP LATERAL BIPOLAR ELECTRONIC DEVICE AND CORRESPONDING MANUFACTURING PROCESS

This application is a divisional of U.S. patent application Ser. No. 09/087,397, filed May 29, 1998, which has issued as U.S. Pat. No. 6,146,956.

TECHNICAL FIELD

This invention relates to an integrated circuit having a PNP bipolar electronic device.

In particular, the present invention relates to a lateral PNP bipolar electronic device which is integrated monolithically on a semiconductor substrate together with other bipolar devices of the NPN type.

BACKGROUND OF THE INVENTION

As is well known, preference is given to NPN transistors for implementing integrated circuitry of the bipolar type on semiconductor substrates, on account of their direct and alternating current amplifications being definitely better than those of PNP transistors.

Another disadvantage of PNP bipolar transistors is their close limitations in high frequency applications.

Despite all this, the inclusion of both NPN and PNP transistors on a common semiconductor substrate is still a necessity where suitable bias circuits, current mirror circuits and/or load devices for gain stages are to be provided.

The formation of PNP transistors on a semiconductor substrate is effected concurrently with that of NPN transistors, without any additional implanting or masking steps.

It is for this reason that it has become common practice to form PNP bipolar transistors of the so-called lateral type such that they can be compatible with the process flows adopted to fabricate NPN bipolar devices.

In this respect, FIG. 1 shows an enlarged cross-sectional view, taken on a vertical plane, of a lateral PNP device 6 formed on a P-type semiconductor substrate 1.

The following are successively deposited onto this substrate 1: a first buried layer 2 doped N+ to form the base region of the transistor, and a second layer 3, doped N, which constitutes the active area of the PNP device to be.

Thereafter, a selective diffusion of P-type dopants is effected in the active area 3 to define a central emitter region 4 surrounded by collector 5.

This solution has been widely used heretofore, to the point that a text, "Design and Realization of Bipolar Transistors", Peter Ashburn, page 157, gives it as the principal configuration for a lateral PNP device that can ensure of a good current gain.

It should be noted that such lateral PNP transistors have an intrinsic current loss of about 3% compared to their respective collector currents; these currents can also be explained theoretically by having reference to the diagram in FIG. 2 of an equivalent electric circuit of a lateral PNP transistor.

It can be seen in FIG. 2 that the lateral PNP device, designated $Q_1$ in the equivalent circuit, is connected to a pair of parasitic PNP transistors $Q_2$ and $Q_3$ having their emitter regions connected to the emitter and collector regions, respectively, of the transistor $Q_1$.

In addition, these parasitic devices $Q_2$ and $Q_3$ have their collector regions connected to the semiconductor substrate, and their base regions in common with the base region of $Q_1$.

This equivalent electric circuit diagram shows that the parasitic currents are mainly attributable to the second parasitic device $Q_2$ draining toward the substrate some of the current being injected by the emitter of $Q_1$, thereby lowering the efficiency of lateral emission.

Similar considerations apply to the third parasitic device $Q_3$, which contributes instead to lowering the collection efficiency of the collector of $Q_1$ when the latter is biased into its saturation range.

To overcome drawbacks of this kind, tied to the parasitic currents, a conventional solution has been that of optimizing the efficiency of collection of the carriers in the collector region, so as to maximize the gain of lateral transistors.

For this reason, lateral PNP transistors have been implemented conventionally with their emitter region occupying, in the active area, a central position surrounded by two collector regions.

While being in many ways advantageous, this prior solution has a serious drawback in that it leads to increased values of certain characteristic parameters of the lateral PNP transistor, such as the base-collector and emitter-base capacitances, $C_{bc}$ and $C_{eb}$, which restrict performance at high frequencies.

This drawback is also connected with the considerable spread of the base region in the buried layer brought about by the need to control the lateral PNP device performance in the emitter and collector regions.

Particularly, a width $W_b$ of this base region adversely affects the carrying parameter B*, which is tied to the $W_b$ by the following formula:

$$B^* \approx 1 - \frac{Wb^2}{2D\tau} \tag{1.1}$$

where D is the diffusion value, and t is the re-combination time of the carriers.

It should be noted that the B* factor is inversely proportional to a passage time through the base region, so that as it increases, the frequency performance of the lateral PNP device deteriorates.

Unfortunately, this type of lateral PNP device reveals serious limitations when attempts are made to improve its high frequency performance.

These limitations come from the practical impossibility of bringing the collector regions closer to the central emitter region.

This is both attributable to the photolithographic masks used for transferring the patterns of the active region, and to side diffusion effects during the formation of the emitter and collector regions, as well as to breakdown effects which may occur in a region between the base and the collector.

Consequently, the width $W_b$ of the base region of the lateral PNP transistors always exhibits values between 2 μm and 4 μm.

FIG. 3 is a vertical cross-section view, to an enlarged scale, of a conventional lateral PNP transistor, highlighting polysilicon contacts 10 above the emitter 4 and collector 5 regions.

These contacts 10 are characterized by the presence of so-called "bird's beaks" which jut out sideways from the emitter and collector regions. The possibility of altering the width Wb of the base channel is usually hindered by the bird's beak protrusions.

In fact, calling $W_{PPL}$ the distance between the emitter and the collector, $L_{BB}$ the reach of the bird's beak, and D the misalignment between the polysilicon contact layer 10 and the active area, then:

$$W_B > W_{PPL} + 2*L_{BB} + 2*D$$

And substituting for some real sample values of such distances, we get:

$$W_B \leq 1.0 + 2*0.5 + 2*0.4 = 2.8 \ \mu m$$

$$W_B \leq 1.0 + 2*0.5 + 2*0.15 = 2.3 \ \mu m.$$

Thus, the heaviest restriction on the reduction of the base channel width appears to be due to the process implementation, rather than to its topography.

From FIG. 4, showing a schematic detail view of FIG. 3, it is evinced that the bird's beak partly overlaps the active area and that a window through which the implantation of $BF_2$ is effected is reduced accordingly.

This results in the creation of a $P^+$-N junction within the polysilicon layer deposited, which keeps the base and collector currents far from the ideal.

SUMMARY OF THE INVENTION

In light of the foregoing considerations, an object of this invention is to provide a new topography conferring, on a lateral PNP device, such structural and functional features as to make it suitable for high frequency applications as well, thereby overcoming the aforesaid limitations and drawbacks.

Another object of this invention is to define the width of the base channel by way of the emitter structure. Particularly, an object of this invention is to reduce substantially the width of the base channel. In fact, a reduction in the base channel width would ensure an improved value of the carrying factor B*.

These and other objects of the present invention can be accomplished by providing a lateral PNP bipolar transistor having a substrate doped with impurities of the P type, a first buried layer doped with impurities of the N type to form a base region, and a second layer, overlying the first layer and having a conductivity of the N type, to form an active area with collector and emitter regions being formed in said active area and separated by a base channel region wherein a width of the base channel region is defined essentially by a contact opening formed above an oxide layer deposited over the base channel region.

The features and advantages of the inventive device will be apparent from the following description of the embodiment thereof, given by way of non-limitative example with reference to the accompanying drawings.

BRIEF DESCRIPTION OF THE DRAWINGS

FIGS. 5 to 7 are vertical cross-section and time succession views, respectively showing schematically a portion of the semiconductor substrate whereon a lateral PNP device according to the invention is formed.

FIGS. 8 to 10 are schematic vertical cross-section and time succession views, respectively showing schematically a portion of the semiconductor substrate whereon a vertical NPN device is formed.

DETAILED DESCRIPTION OF THE INVENTION

Figure 1:
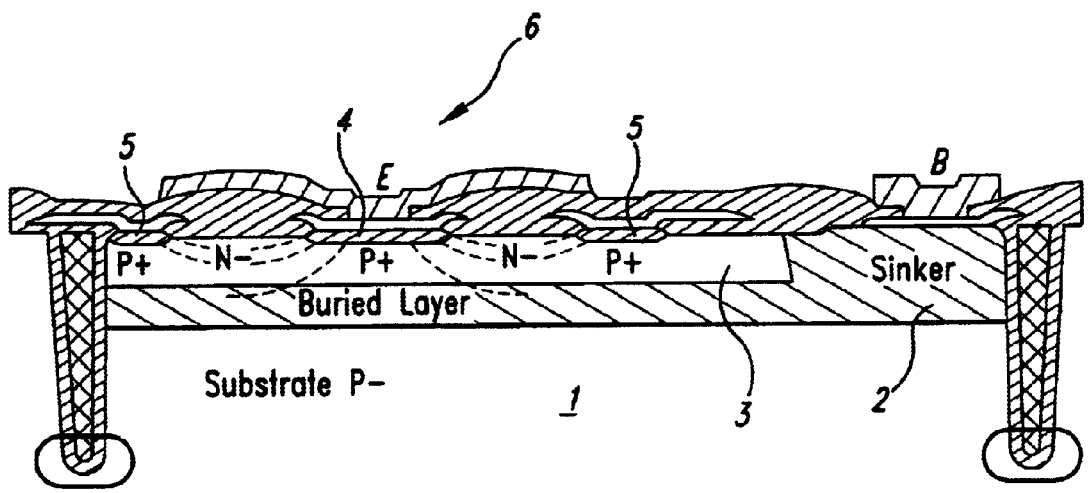
FIG. 1 is an enlarged-scale sectional view taken on a vertical plane of a lateral PNP device integrated on a semiconductor substrate, according to the prior art.
Figure 2:
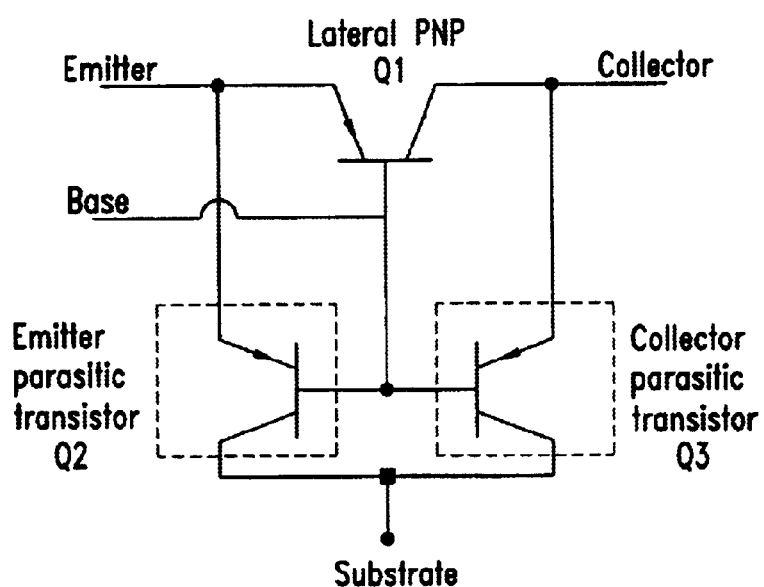
FIG. 2 shows schematically an equivalent electric circuit of a lateral PNP device integrated on a semiconductor substrate, according to the prior art.
Figure 3:
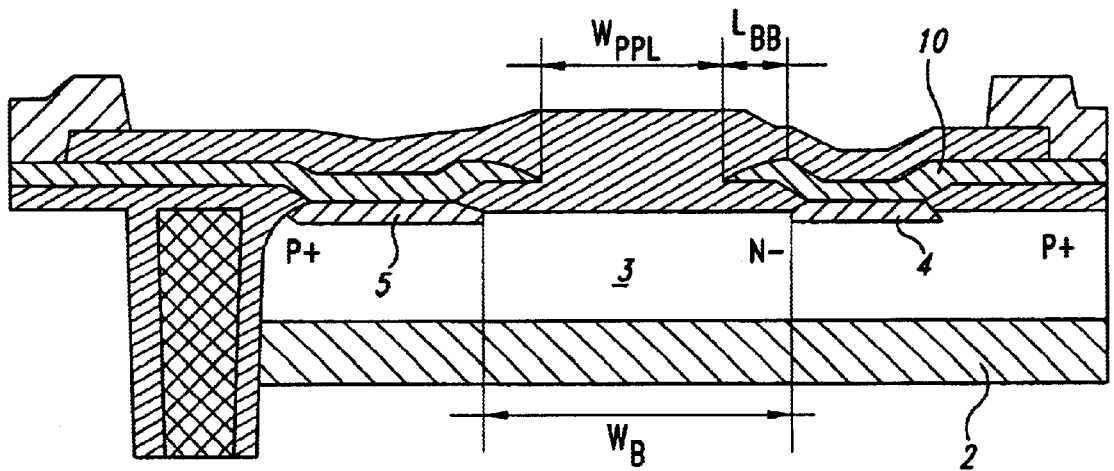
FIG. 3 is an enlarged-scale sectional detail view, taken on a vertical plane, of a lateral PNP device integrated on a semiconductor substrate, according to the prior art.
Figure 4:
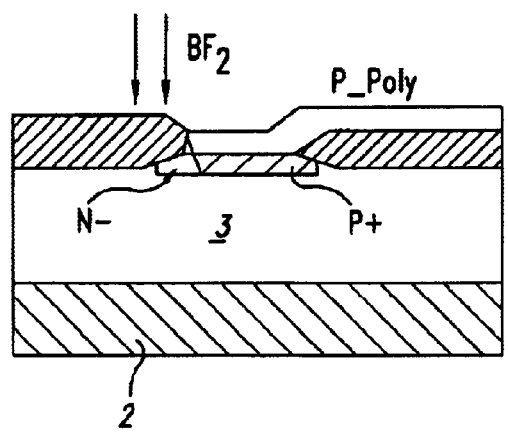
FIG. 4 is a partly enlarged detail view of FIG. 3.

Referring to FIGS. 5–7, a preferred embodiment of a lateral PNP device 15 monolithically integrated on a semiconductor substrate together with other NPN devices, shown in FIGS. 8–10, will now be described. The device 15 can be advantageously operated even at high frequencies.

A multilayer structure, electrically isolated from other integrated devices by the selective growing of isolation oxide regions 11, has been formed on a P-type semiconductor substrate 23.

This multilayer structure is produced by successive deposition, onto the substrate 23, of a first buried layer 20 doped for conductivity of the N type to form a base region, and of a second epitaxial layer 13, over the first buried layer 20, with conductivity of the $N^{31}$ type representing an active area of the lateral PNP device 15.

A fabrication process for the present invention includes the definition of an emitter region 14 and a collector region 12.

For this purpose, a first step of selectively diffusing P-type dopants onto predetermined portions of the surface of the active area is carried out. At the end of this operation, the emitter region 14 will be locate peripherally to the active area, opposite from the collector region 12.

At this point, a polysilicon layer 16 is deposited onto the substrate surface and capped with a protective layer 17 of vapor deposited oxide (VAPOX). This layer 17 can be formed by oxidation of the polysilicon 16.

By a subsequent dry etching step, an opening 18 is defined through the layers 17 and 16, above the field oxide 11. This etching is carried out with the assistance of an emitter mask, called the EMI mask, being shifted to the appropriate location.

The opening 18 is defined in the same manner as an opening 18' during the formation of the NPN transistors included in the same integrated circuit, as shown in FIG. 8.

This step allows the emitter 14 and collector 12 regions to be separated from each other and prevents misalignment of the masks.

A layer 19 of nitride is then deposited through the opening 18 and caused to adhere on the side walls of the opening.

A pair of spacers 21 are successively formed within the opening 18 over the nitride layer 19.

The spacer structure 21 is self-aligned to the spacer structure formed in the NPN transistors, as shown in FIGS. 6 and 9.

The process of this invention further includes a step of forming an N-doped polysilicon contact 22. The contact is formed at the location of the opening 18 and allowed to reach the surface of the oxide 11.

A similar N-poly contact is also formed in the window 18' overlying the active areas of the NPN transistors.

The polysilicon contact 22 is then contacted by a first metallization layer (not shown) formed on either the emitter or the collector side.

FIG. 7 clearly shows the width of the base channel region, comprising a middle portion with a width $W_E$ and two opposite regions with a width D formed from the portion of the layer 16 that overlaps the oxide region 11.

Thus:

$$W_B \geq W_E + 2*D$$

Substituting for some real sample values of such distances, then:

$$W_B \geq 0.8 + 2*0.4 = 1.6 \ \mu m$$

$$W_B \geq 0.4 + 2*0.2 = 0.8 \ \mu m.$$

It will be readily appreciated from the above values that the process of this invention is highly beneficial in terms of reducing base channel width.

The results of actual tests carried out by the Applicant with the lateral PNP device 15 of the present invention have confirmed the advantages of this solution.

The adopted solution also allows the size of the lateral PNP device described hereinabove to be reduced, thereby further improving its frequency performance.

In conclusion, this lateral PNP device can be operated at high frequencies, with suitable collector current values and good amplification, to provide a superior figure of merit compared to that typical of conventional lateral PNP devices.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A lateral PNP bipolar electronic device integrated monolithically on a semiconductor substrate together with another bipolar device of the NPN type, said device comprising:
   a semiconductor substrate doped with P type impurities;
   a buried first layer doped with N type impurities to form a base region; and
   a second layer, overlying the first layer and having an N type conductivity, to form an active area; collector and emitter regions being formed in said active area and separated by a base channel region;
   a third layer positioned above the second layer and having an opening that defines in part a width of the base channel region, the third layer including a non-oxide layer;
   a first oxide layer positioned between the base channel region and the third layer, the first oxide layer extending under, and laterally beyond, the opening in the third layer; and
   a nitride layer positioned to extend through said opening.

2. The lateral PNP bipolar electronic device according to claim 1 wherein said third layer includes a polysilicon layer and a second oxide layer above the polysilicon layer.

3. The lateral PNP bipolar electronic device according to claim 2, wherein the second oxide layer and the polysilicon layer are positioned directly above the first oxide layer and said opening is formed in the second oxide layer and the polysilicon layer.

4. The lateral PNP bipolar electronic device according to claim 1 wherein the nitride layer is one of plural nitride spacers positioned on the first oxide layer and contacting opposite sidewalls of the third layer defining the opening.

5. An integrated circuit having a lateral PNP bipolar device, comprising:
   a P-type semiconductor substrate;
   an N-type buried first layer to form a base region;
   an N-type second layer, deposited over the first layer, to form an active area with a collector region and an emitter region being formed in the active area;
   a patterned first oxide layer deposited over the second layer to define a base channel region having a width wherein said collector and emitter regions are separated by the base channel region;
   a conductive third layer positioned above the patterned first oxide layer, wherein the width of the base channel region is defined in part by an opening formed in the third layer over the base channel region; and
   nitride sidewalls positioned in the opening and immediately adjacent to sidewalls of the opening.

6. The lateral PNP bipolar device of claim 5 wherein the width of the base channel region comprises a width of the opening plus predetermined overlapping portions of the first oxide layer.

7. The lateral PNP bipolar device of claim 5, wherein said nitride sidewalls extend laterally in the opening on the patterned first oxide layer.

8. The lateral PNP bipolar device of claim 7, wherein the third layer includes a polysilicon layer, the device further comprising a second oxide layer above the polysilicon layer, the nitride spacers extending in an opening in the second oxide layer.

9. An intermediate product for creation of an integrated circuit having a lateral bipolar device, comprising:
   a semiconductor substrate;
   a first layer buried in the substrate to form a base region;
   a second layer, deposited over the first buried layer, to form an active area with a collector region and an emitter region being formed in the active area;
   a patterned oxide layer deposited over the second layer to define a base channel region having a width wherein said collector and emitter regions are separated by the base channel region;
   a third layer positioned on the patterned oxide layer and above the base channel region, wherein an opening is formed in the third layer directly above the base channel region; and
   sidewall spacers positioned in the opening and immediately adjacent to sidewalls of the third layer that define the opening, the sidewall spacers including nitride sidewalls deposited within the opening and adhering to the sidewalls of the opening, and polysilicon spacers positioned between the nitride sidewalls.

10. The intermediate product of claim 9 wherein the width of the base channel region comprises a width of the opening plus predetermined overlapping portions of the patterned oxide layer.

11. The intermediate product of claim 9, wherein the nitride sidewalls extend laterally in the opening on the patterned oxide layer.

12. The intermediate product of claim 11, wherein the third layer includes a polysilicon layer and an oxide layer above the polysilicon layer.

* * * * *